(12) United States Patent
Taylor et al.

(10) Patent No.: US 8,749,231 B2
(45) Date of Patent: Jun. 10, 2014

(54) SENSING A FIELD WITH A SENSOR THAT INCLUDES BIAS RESETTING OF AN ACTIVE DEVICE OF THE SENSOR

(75) Inventors: Andrew T. Taylor, Santa Rosa, CA (US); Joseph Miller, Santa Rosa, CA (US)

(73) Assignee: PNI Sensor Corporation, Santa Rosa, CA (US)

( * ) Notice: Subject to any disclaimer, the term of this patent is extended or adjusted under 35 U.S.C. 154(b) by 448 days.

(21) Appl. No.: 13/175,991

(22) Filed: Jul. 5, 2011

(65) Prior Publication Data

US 2013/0009635 A1 Jan. 10, 2013

(51) Int. Cl.
*G01R 33/02* (2006.01)
(52) U.S. Cl.
USPC .......................................... 324/244
(58) Field of Classification Search
USPC .......................................... 324/244
See application file for complete search history.

(56) References Cited

U.S. PATENT DOCUMENTS

| 4,728,888 | A | * | 3/1988 | Bauer et al. | 324/253 |
| 4,733,181 | A | * | 3/1988 | Bauer | 324/253 |
| 5,239,264 | A | | 8/1993 | Hawks | |
| 7,053,608 | B2 | * | 5/2006 | Friend et al. | 324/244 |

OTHER PUBLICATIONS

"Low-Frequency-Noise Reduction Technique for Linear Analog CMOS IC's", 2005 Jeongwook Koh, Lehrstuhl für Technische Elektroniks der Technischen Universität München Univ.-Prof. Dr. rer. nat. Doris Schmitt-Landsiedel.
"A Model for Switched Biasing MOSFET 1/f Noise Reduction", Jakob M. Tomasik, Carsten Bronskowski and Wolfgang H. Krautschneider,Manuscript. Jakob M. Tomasik, Carsten Bronskowski and Wolfgang H. Krautschneider are with the Institute of Microelectronics , Hamburg University ofTechnology, Eissendorfer Str. 38, D-21073 Hamburg, Germany.

* cited by examiner

*Primary Examiner* — Reena Aurora
(74) *Attorney, Agent, or Firm* — Brian R. Short

(57) ABSTRACT

Apparatuses, methods and systems of sensor sampling of a field are disclosed. One apparatus includes a magnetometer that includes a sensor responsive to an applied field. Embodiments of the sensor include an active device and oscillator circuitry, wherein the sensor generates an output signal having a frequency that is dependent on the applied field. The magnetometer further includes a bias reset controller for resetting a bias of the active device and a sampler for sampling the output signal. Further, a reset-rate of the resetting of the bias of the active device is high enough to influence 1/f noise generated by the active device.

32 Claims, 13 Drawing Sheets

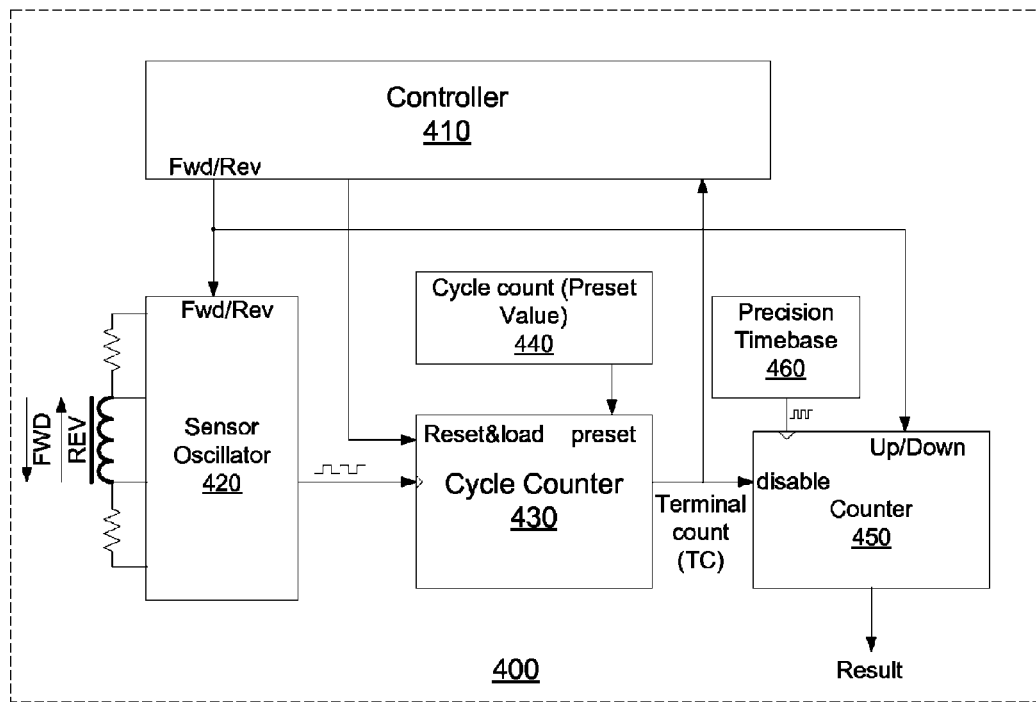
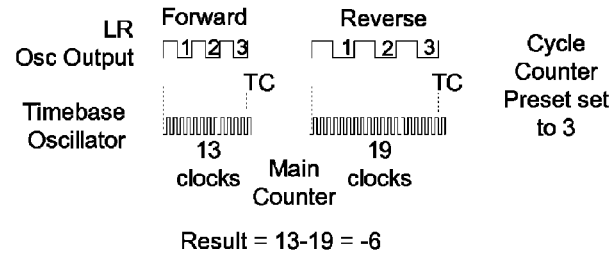
Result = 13-19 = -6
FIGURE 4

Subjecting a sensor to the field, wherein the sensor comprises an active device and oscillator circuitry, wherein the sensor generates an output signal having a frequency that is dependent on the field

1210

Resetting a bias of the active device, wherein the bias of the active device is reset at a rate high enough to influence 1/f noise generated by the active device

1220

Counting samples of the output signal with a signed up/down counter, wherein an output of the signed up/down counter provides a representation of an intensity and a direction of the applied field

SENSING A FIELD WITH A SENSOR THAT INCLUDES BIAS RESETTING OF AN ACTIVE DEVICE OF THE SENSOR

FIELD OF THE EMBODIMENTS

The described embodiments relate generally to sensing a stimulus. More particularly, the described embodiments relate to apparatuses, methods and systems for sensing a field with a sensor that include bias resetting of an active device of the sensor.

BACKGROUND

Digital signal oversampling is a practice often implemented to increase a systems Signal to Noise Ratio (SNR). Increasing amounts of oversampling can increase SNR with a ratio proportional to the square-root of the amount of oversampling computed. Similar to a decreasing a Low-Pass-Filter's (LPF) cutoff frequency, increasing oversampling decreases the bandwidth of the response and improves errors due to signal aliasing.

Additionally, oversampling increases system resolution. The usefulness of oversampling, however, can be limited when a high bandwidth response from the data is desired, or when the remnant noise after oversampling does not diminish as would be expected from a system with only White noise. White noise is a random noise with flat spectral density and is the most common noise type encountered. However, another type of noise, called 1/f noise can be observed as a lower bandwidth limit where the noise no longer diminishes as the oversampling is increased. Most systems, particularly small feature sized CMOS semiconductor based circuits, have noticeable amounts 1/f noise. A 1/f corner occurs at low frequencies (or increased integration times of a filter) and is where the 1/f noise begins to dominate over White noise. This can lead to the conclusion that the maximum SNR that can be achieved from a sampling system is at the 1/f corner.

It is desirable to have apparatuses, methods, and systems for reducing the effects of 1/f noise on sampled signals.

SUMMARY

One embodiment includes a magnetometer. The magnetometer includes a relaxation oscillator that includes at least one coil that is responsive to an applied field, wherein the relation oscillator generates an output signal that has a frequency that is dependent upon the applied field. The magnetometer further includes a bias reset control for resetting a bias of the relaxation oscillator at a rate high enough to influence 1/f noise, and a sampler for sampling the output signal.

Another embodiment includes a magnetometer. The magnetometer includes a sensor responsive to an applied field. Embodiments of the sensor include an active device and oscillator circuitry, wherein the sensor generates an output signal having a frequency that is dependent upon the applied field. The magnetometer further includes a bias reset controller for resetting a bias of the active device and a sampler for sampling the output signal. Further, a reset-rate of the resetting of the bias of the active device is high enough to influence 1/f noise generated by the active device.

Another embodiment includes magnetometer. The magnetometer includes a sensor responsive to an applied field, that includes an active device and oscillator circuitry, wherein the sensor generates an output signal having a period that is dependent upon the applied field. The magnetometer further includes a bias reset controller operative to reset a bias of the active device, wherein a reset-rate of the resetting of the bias of the active device is high enough to influence 1/f noise generated by the active device. Further, the magnetometer includes a signed up/down counter, wherein an output of the signed up/down counter provides a representation of the intensity and a direction of the applied field.

Another embodiment includes a method of sensing a magnetic field. The method includes subjecting a magnetometer to the magnetic field, wherein the magnetometer includes a relaxation oscillator with at least one coil responsive to the magnetic field, wherein the output signal has a frequency that is dependent upon the magnetic field. The method further comprises resetting a bias of said relaxation oscillator at a rate high enough to influence 1/f noise, and sampling the output signal.

Another embodiment includes another method of sampling a field. The method includes subjecting a sensor to the field, wherein the sensor includes an active device and oscillator circuitry, wherein the sensor generates an output signal having a frequency that is dependent on the field. The method further includes resetting a bias of the active device, and sampling the output signal, wherein the resetting of the bias of the active device is at a rate that is high enough to influence 1/f noise generated by the active device.

Another embodiment includes another method of sampling a field. The method includes subjecting a sensor to the field, wherein the sensor includes an active device and oscillator circuitry, wherein the sensor generates an output signal having a frequency that is dependent on the field. The method includes counting samples of the output signal with a signed up/down counter, wherein an output of the signed up/down counter provides a representation of the intensity and a direction of the applied field. The method further includes resetting a bias of the active device, wherein the resetting of the bias of the active device is at a rate that is high enough to influence 1/f noise generated by the active device.

Other aspects and advantages of the described embodiments will become apparent from the following detailed description, taken in conjunction with the accompanying drawings, illustrating by way of example the principles of the described embodiments.

BRIEF DESCRIPTION OF THE DRAWINGS

FIG. 4 shows an example of a magnetic field sensor that includes a pair of counters for providing a value representing an intensity and direction of a sensed magnetic field.

FIG. 6A is a plot that shows an example of saturating growth of 1/f noise with time an active device is on.

FIG. 12 is a flow chart that includes the steps of an example of a method of sensing a field.

DETAILED DESCRIPTION

The described embodiments provide sensors that include resetting of active devices within the sensors. Resetting the active devices provides for improved (lower) noise within sensed signals because resetting the active devices within the sensors reduces 1/f noise. These embodiments can be useful in sampling systems because 1/f noise of active devices of the sensors can be reduced, and therefore, have less influence on a sampling system output sampled signal. For a specific embodiment, the field sensor is a magnetometer. However, other embodiments include other types of sensors.

Introduction to an Embodiment of a Field Sensor

Figure 1A:
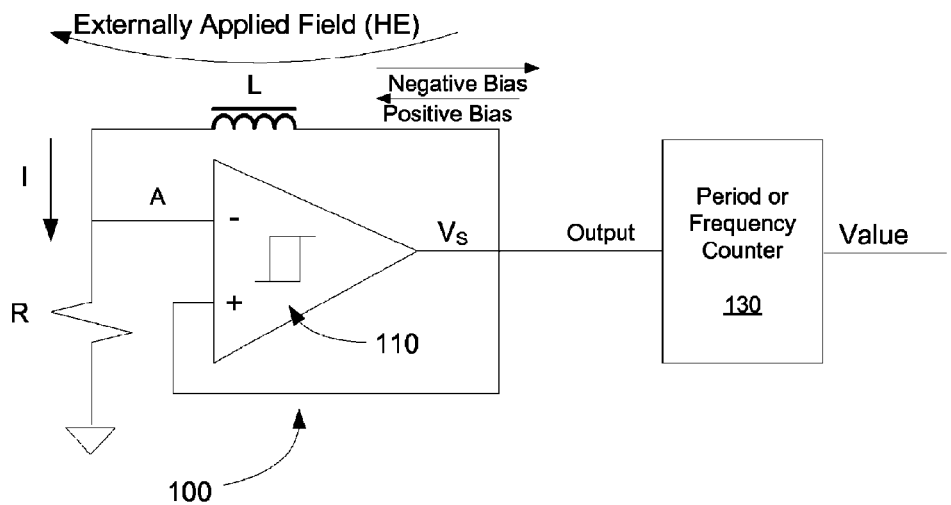
FIG. 1A shows an example of a magnetic field sensor that includes an oscillator, wherein a period of a signal generated by the oscillator is dependent upon an intensity of a sensed magnetic field.

FIG. 1A shows an example of a magnetic field sensor (magnetometer) that includes an oscillator 100, wherein a period of a signal generated by the oscillator 100 is dependent upon an intensity of a sensed external magnetic field. A frequency or period counter 130 receives an output signal of the oscillator. A value of an inductance L of the oscillator is dependent upon the intensity of the externally applied magnetic field. Therefore, the value at the output of the counter 130 is dependent upon the intensity of the externally applied magnetic field.

As shown, $H_E$ represents the external magnetic field parallel to the coil. The total magnetic field the sensor experiences, H, is a function of the external magnetic field and the magnetic field established by the current running through the circuit, I. This can be expressed as:

$$H=k_0 I+H_E$$

where $k_0$ is a constant that depends on certain physical parameters of the sensor.

Figure 1B:
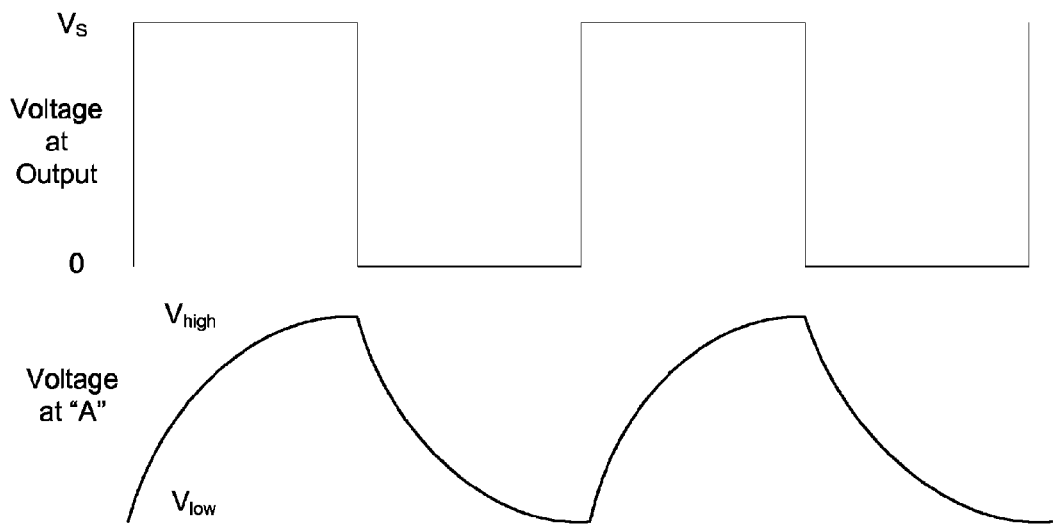
FIG. 1B shows an example of waveforms of the magnetic field sensor of FIG. 1A.

For the circuit of FIG. 1A, assuming a logical "0" value (0V or some value less than the trigger value) on an input to a Schmitt trigger 110, the Schmitt trigger yields an output value that is a logical "1" at some voltage $V_S$. This gradually drives up an input voltage across the sensor 100 until the voltage at (A) reaches a trigger threshold for the Schmitt Trigger, $V_H$. At this point, the Schmitt Trigger 110 detects the voltage at A as a logical "1", and the output of the Schmitt Trigger 110 becomes a logical "0". This drives the voltage down across the sensor 100, setting up an oscillation as depicted below in FIG. 1B. Note that the current, I, essentially mimics the voltage waveform at A.

For embodiments, the magnetic field sensor 100 incorporates a solenoidal-geometry coil (L) wrapped around a high-permeability magnetic core. The sensor's permeability, varies with the applied magnetic field, and consequently, the sensor's inductance, L, is also a function of the magnetic field, H.

Figure 2:
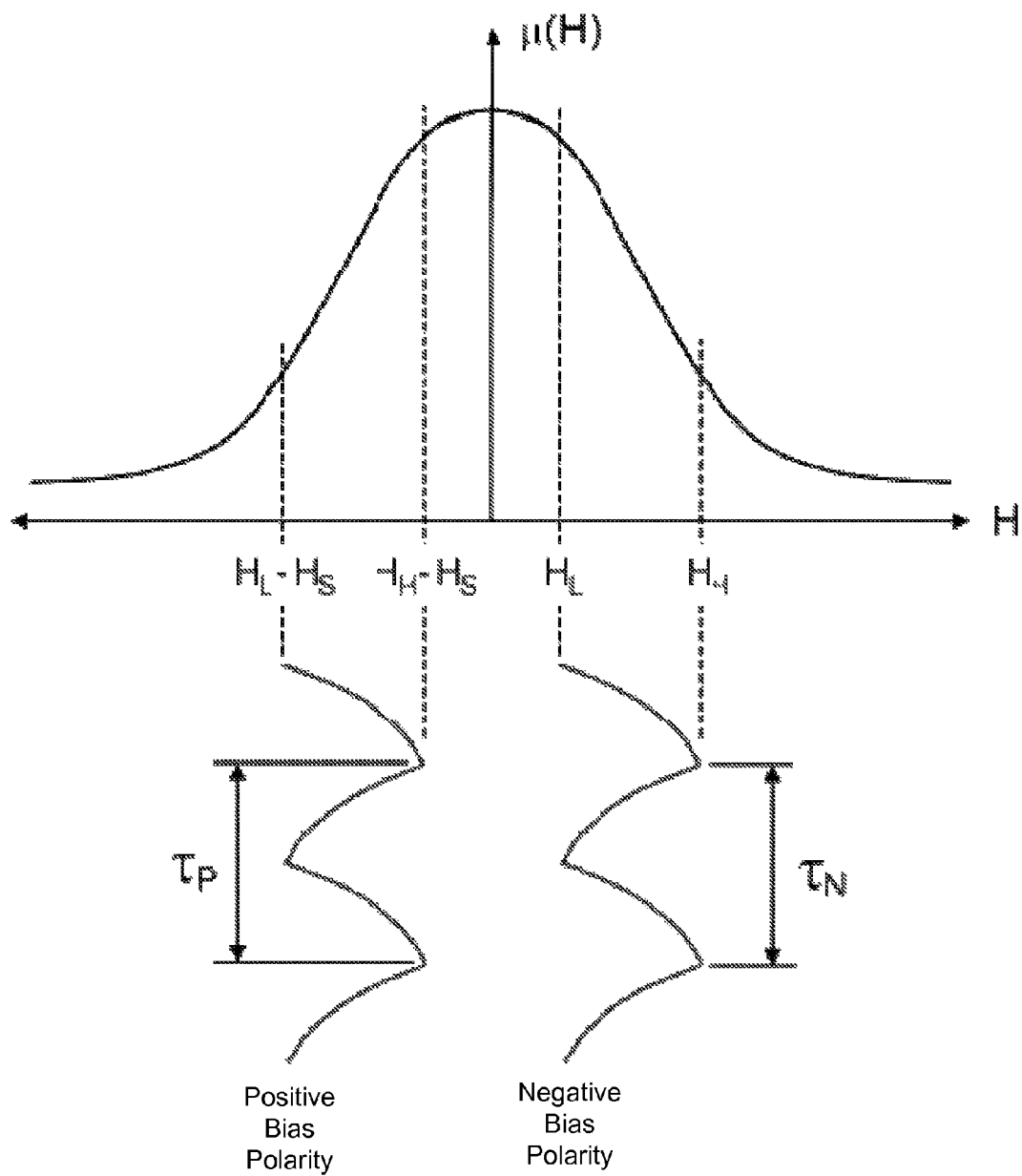
FIG. 2 shows examples of waveforms of a field sensor which is not exposed to an applied external field.

For the circuit depicted in FIG. 1, the bias resistance, R, and drive voltage on the Schmitt Trigger 110 output ($V_S$) are selected such that the sensor's magnetic field is in the non-linear regime of the permeability curve. FIG. 2 depicts the voltage output when the circuit is driven with either a positive or negative bias (as depicted in FIG. 1), but with no applied external magnetic field. Note that the period of oscillation is the same whether the circuit is positively or negatively biased.

Figure 3:
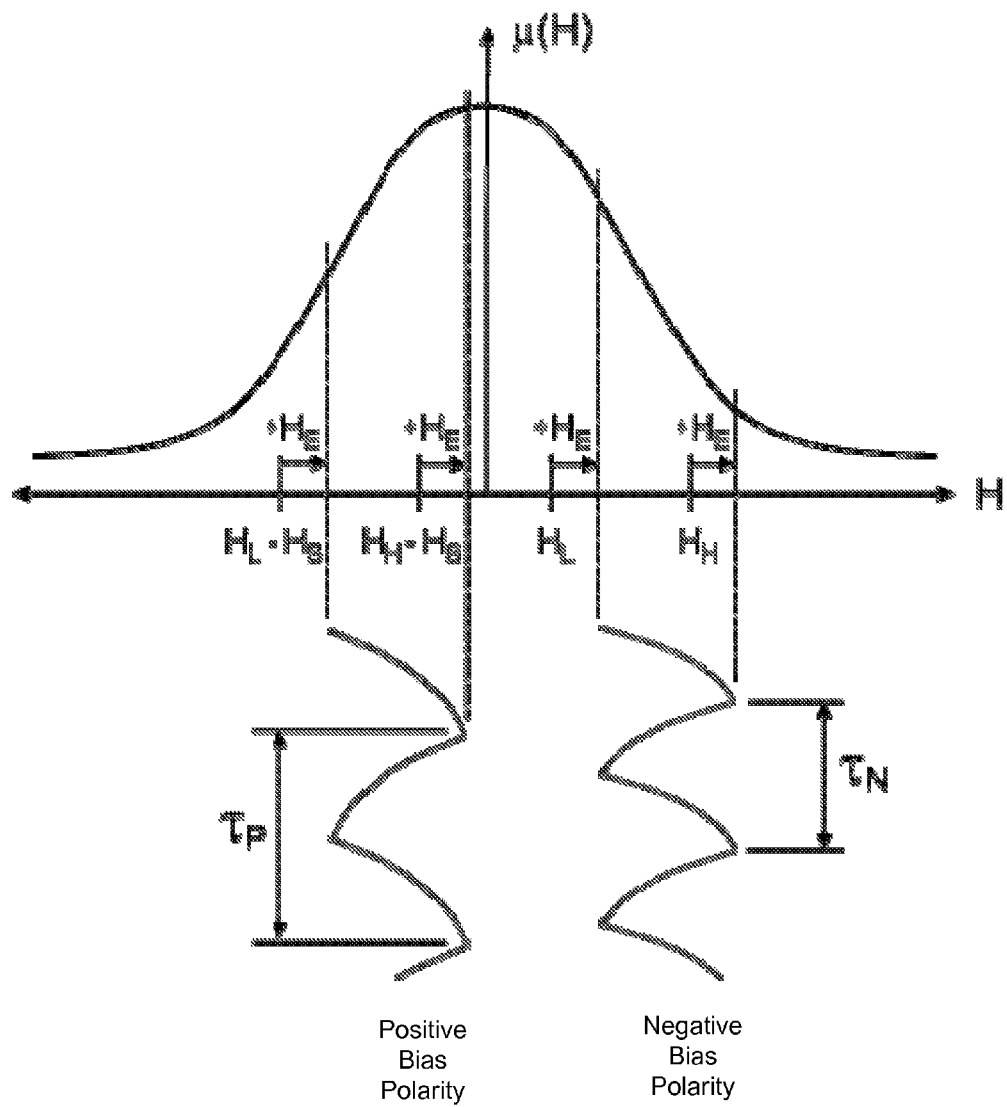
FIG. 3 shows examples of waveforms of a field sensor which is exposed to an applied external field.

When an external magnetic field is applied, $H_E$ (such as Earth's magnetic field), this causes both the positively and negatively biased curves to shift in the same direction. As depicted in FIG. 3, this shift causes the inductance to increase when the circuit is positively biased and to decrease when negatively biased. This, in turn, causes the period between cycles, τ, to increase for the positively biased circuit and decrease for the negatively biased circuit.

By measuring the time to complete a fixed number of oscillations (periods) that occur in the forward and reverse polarity directions and taking the difference between these two values, it is possible to derive the intensity and direction of the external magnetic field.

The magneto-inductive sensing of the sensor of FIG. 1 provides some particularly useful attributes that set it apart from other magnetic sensing technologies. More specifically the output value can be represented digitally. Most other technologies provide an analog output which can be used to derive the strength of the applied magnetic field by observing a change in voltage. In this case, noise either inherent in the circuit or from the surrounding effects the attainable resolution.

FIG. 4 shows an example of a magnetic field sensor 400 that includes a pair of counters 430, 450 for providing a value representing an intensity and direction of a sensed magnetic field. The sensor 400 includes a sensor oscillator 420 that can be similar in structure to the sensor of FIG. 1.

The sensor oscillator 420 includes forward and reverse bias settings as controlled by a controller 410. Basically, the controller 410 sets a bias current through an inductor (for example, a solenoidal-geometry coil) in a forward direction (FWD) and in a reverse direction (REV). By determining the period and/or frequency variation of the output of the sensor oscillator for both the FWD and REV directions, the intensity and direction of the sensed magnetic field can be determined.

A cycle counter 430 counts cycles of the output of the sensor oscillator up to a preset value as determined by a count cycle 440. After the cycle counter 430 has counted to the preset value, the cycle counter 430 generates a terminal count (TC).

A counter 450 times the period required for the cycle counter 430 to generate a TC by counting a clock signal of a precision time-base 460. That is, the counter 450 is enabled and set to count (the clock signal) when the controller 410 sets the sensor oscillator in, for example, the FWD direction. The counter 450 is set to count up for one direction of the bias current, and set to count down for the other direction of the bias current. The result of the counter is dependent on the intensity of the applied magnetic field and the direction of the applied magnetic field. As shown in FIG. 4, an example of a preset value of the count cycle is 3. The counter 450 counts the high-speed clock cycle over the duration of time it takes for the cycle counter 430 to count 3 cycles of the output signal of the sensor oscillator 420. The example of FIG. 4 shows the counter 450 counting to 13 for the FWD bias, and counting down 19 for the REV bias, yielding a counter result of −6. This output (−6) provides an accurate representation of the intensity and direction of the sensed magnetic field.

The sensitivity of the magnetic sensor and sampler combination 400 can be increased by increasing the value of the count cycle. That is, as the time period of the counting is increased, the sensitivity and signal to noise ratio (SNR) increases. However, at some point, the SNR of the sampled signal can no longer be improved due to the presence of 1/f noise of the sensor oscillator.

Discussion of 1/f Noise

Figure 5A:
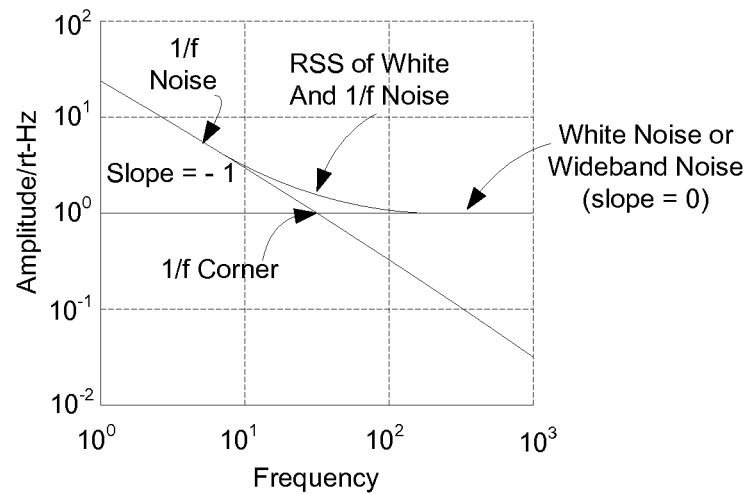
FIG. 5A is a plot that shows an example of power spectral density of white noise and 1/f noise of an active device.

A technique can be employed in electronic systems to reduce 1/f noise (also known as low frequency noise or flicker noise) of the electronic systems. This technique includes averaging multiple samples at higher frequencies (lower integration periods) to yield the same high precision and low resolution as a single measurement at lower integration periods (or lower bandwidth) with intention on using the time between samples to clear the problem associated with low frequency noise. Most electronic systems, particularly those designed around submicron CMOS technologies generate 1/f noise at low bandwidths. Noise bandwidth and system bandwidth or measurement bandwidth are often interchanged since they are proportional to one another but at different scales. The systems' filters and/or integration functions control bandwidth. At low bandwidths 1/f noise can dominate and rise above wide bandwidth noise at a rate of 1/f, or slope of −1/f as it rises as bandwidth decreases. At higher frequencies white noise dominates. The point at which they (1/f noise and white noise) cross is known as the 1/f corner, as shown in FIG. 5A. FIG. 5A is a plot that shows an example of power spectral density of white noise and 1/f noise of an active device.

Figure 5B:
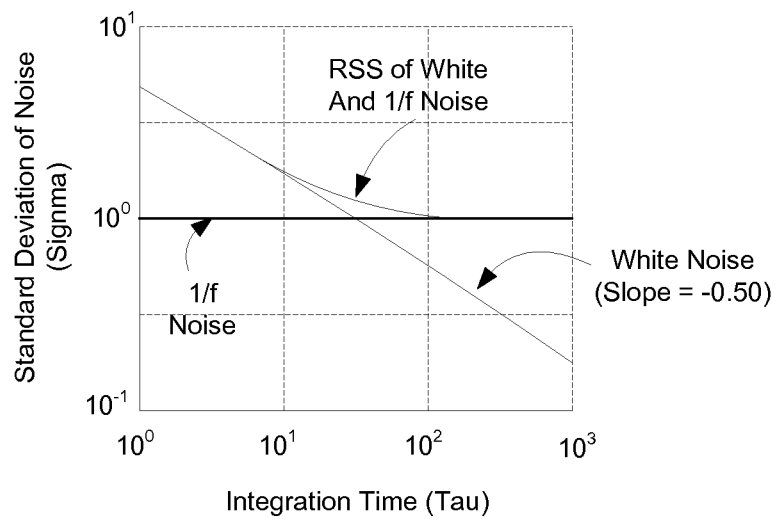
FIG. 5B is a plot that shows an example of a standard deviation of white noise and 1/f noise versus integration time (Tau), of an active device.

Wideband noise has uniform (slope=1) power spectral density (PSD) and at any particular bandwidth its distribution is Gaussian (AKA white). The uniform PSD of white noise causes the measured noise to increase with the square-root of the bandwidth. This decreases the ratio of the observed signal to observed noise. This ratio is known as Signal to Noise Ratio or simply SNR. In a system with only white noise, averaging multiple measurements at higher bandwidths results in the same SNR as single measurements with low bandwidth given that the product of the number of samples and the measurement duration (1/bandwidth) of the high bandwidth measurements equals the duration (1/bandwidth) of the single low bandwidth measurement. If low frequency noise is present in this scenario, the low frequency noise is not averaged out over multiple samples because the overall duration of the measurement in both cases is roughly the same and during this time the bias of the system is fluctuating. Essentially, the 1/f noise can be viewed as fluctuations in the time domain. FIG. 5B shows the characteristics of these noise processes in the time domain. More specifically, FIG. 5B is a plot that shows an example of a standard deviation of white noise and 1/f noise versus integration time (Tau in a Sigma-Tau plot), of an active device. Instead of noise density versus frequency, FIG. 5B shows standard deviation noise (Sigma) versus Integration time (Tau). FIG. 5B shows that as integration time increases (more filtering being applied) the white noise contribution to the Root-Sum-Square (RSS) of both noise processes reduces, however the 1/f contribution remains constant.

Characteristics and Effects of 1/f Noise Upon Turning on a Circuit

In active device systems turning off, for example, transistors that are generating 1/f noise, and then turning the transistors back on, can reduce 1/f noise generated by the transistors when they are turned back on, up until a point in time in which the low frequency 1/f noise rises above, for example, wideband noise. One theory is that imperfections in the channels of silicon transistors during conduction create traps for electrons. Turning off the current through these devices causes them to empty these traps of electrons that cause this noise. This process can be referred to as "bias resetting". During turn on, a device's 1/f noise amplitude remains low until enough of these traps fills and begin to release electrons. When these traps release electrons they tend to do so in clusters creating what can be called Random Telegraph Signals (RTS) because of the signal's resemblance to telegraph signals. The combination of multiple traps with slightly different time constants at which they trap and release electronics in clusters creates the characteristic 1/f shape in spectral plots. As stated, the amplitude of this noise signal starts at zero at circuit turn-on or bias reset and increases until it reaches its full amplitude. Through experimentation, it has been estimated that the turn-on characteristic follows the Monomolecular Model for saturating exponential grown (equation 1 below).

$$f(t) = 1 - e^{\frac{-t}{\tau}} \quad (1)$$

Figure 6A:
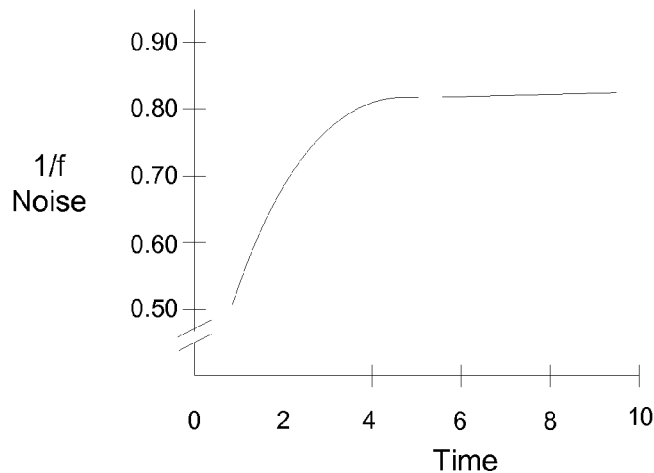
Figure 6B:
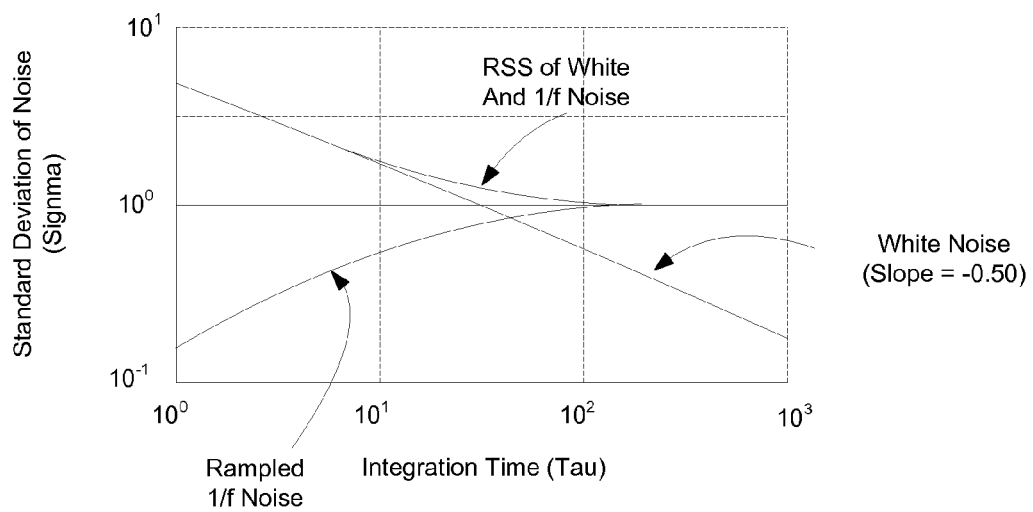
FIG. 6B is a plot that shows an example of a standard deviation of white noise and 1/f noise versus integration time, of an active device that is reset.

FIG. 6A is a plot that shows an example of saturating growth of 1/f noise with time an active device is on. That is, FIG. 6A shows the standard deviation of noise (or RMS noise amplitude) versus increasing integration time of a system with White noise and 1/f noise that grows in amplitude from zero at circuit turn on. Specifically because the X-axis is integration time of a filtered system, the "Ramped 1/f Noise" curve shown in FIG. 6B is the cumulative average of the saturating exponential growth of the 1/f noise. FIG. 6B is a plot that shows an example of a standard deviation of white noise and 1/f noise versus integration time, of an active device that is reset.

An equation for a basic cumulatively averaged saturating exponential growth Function without biases or scale is given in Equation 2.

$$f(\tau) = \frac{\int_{i=0}^{\tau} \left(1 - e^{\frac{-i}{T_k}}\right)}{\tau} \quad (2)$$

Where:
τ=integration time (tau)
$T_k$=time constant of 1/f turn-on.

The amplitude of integrated White noise is a product of its noise density and the square-root of the bandwidth. In terms of integration time this trend is the inverse of the square-root of the integration period as shown in Equation 2.

The trend in the integrated White noise can be represented by equation 3;

$$\frac{1}{\sqrt{\tau}} \quad (3)$$

The total noise floor for a system with ramped 1/f noise in terms of integration time can be represented by:

$$\sqrt{\left(\frac{1}{\sqrt{\tau}}\right)^2 + \left(\frac{\int_{i=0}^{\tau}\left(1-e^{\frac{-i}{Tk}}\right)}{\tau}\right)^2} \quad (4)$$

Oversampling at Integration Periods in the Pre-Saturation Regions of 1/f Growth

Oversampling is a method of reducing unwanted white noise in a desired signal but typically has no effect on 1/f noise. Therefore, it is not obvious that an oversampled signal will be affective when a signal is 1/f noise limited. However, in a sampling system with ramped 1/f noise, oversampling can increase resolution and reduce noise if the integration time of the samples is shorter in time than the saturation time of the growth of the 1/f noise. In practice, this requires the 1/f noise affected circuits be power cycled or bias reset periodically between one or multiple samples. Sampling the signal with short integration periods ($\tau_{os}$) just after a bias reset event produces samples having lower 1/f noise contribution than would be for larger integration times. Additionally, oversampling the signal has the desired effect of reducing white noise with the same effectiveness as a single sample with an integration time equal to the product of the number of samples and the integration time ($n \cdot \tau_{os}$).

$$\sqrt{\left(\frac{1}{\sqrt{n \cdot \tau_{os}}}\right)^2 + \left(\frac{\int_{i=0}^{\tau_{os}}\left(1-e^{\frac{-i}{Tk}}\right)}{\tau_{os}}\right)^2} \quad (5)$$

Equation 5 shows the total noise floor from a system with white and ramped 1/f noise when oversampled where n=number of samples in the oversample lot and $\tau_{os}$ integration time of each sample. Comparing equation 5 with equation 4 shows that equation 4 with $\tau = n \cdot \tau_{os}$ yields more noise due to the increased contribution of the 1/f terms.

Figure 7:
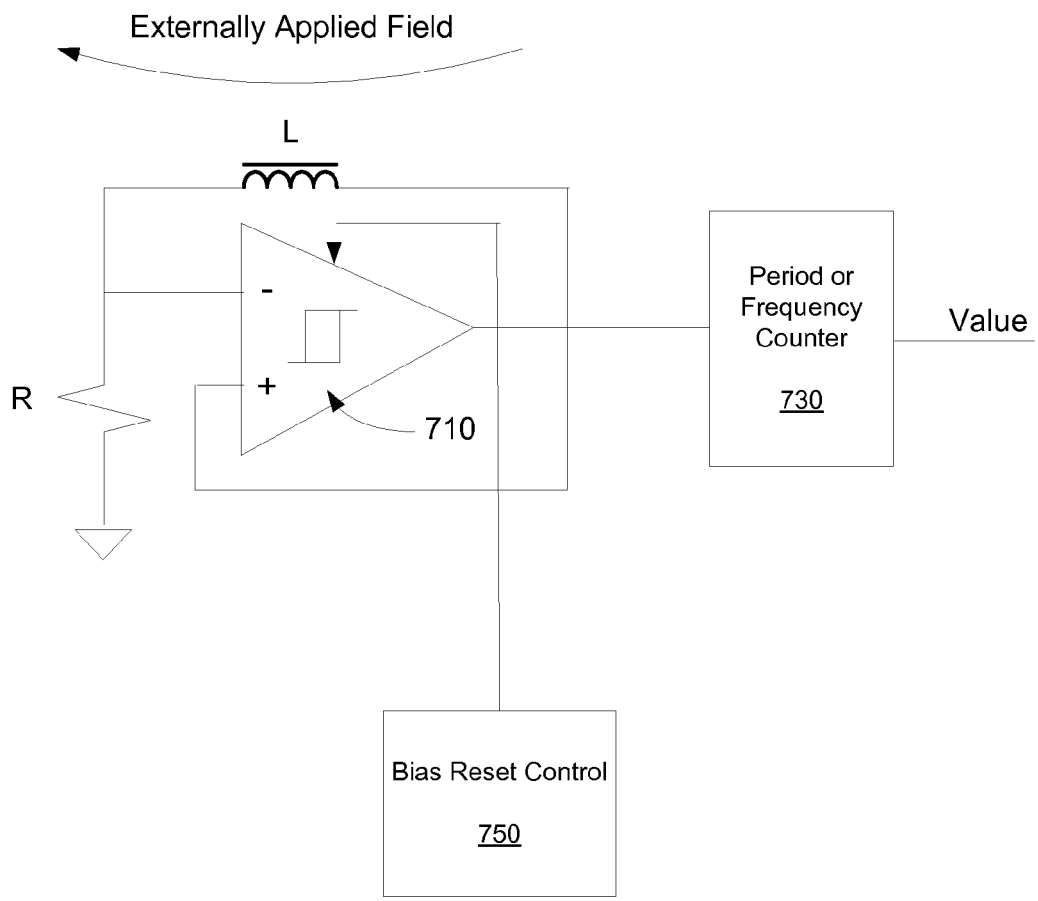
FIG. 7 shows an example of a magnetic sensor that includes reset circuitry for resetting an active device of the sensor for reducing the effects of 1/f noise on an output signal of the magnetic sensor.

FIG. 7 shows an example of a magnetic sensor that includes bias reset circuitry 750 for resetting an active device of the sensor for reducing the effects of 1/f noise on an output signal of the magnetic sensor. Basically, the bias reset circuitry resets an active device, for example, the Schmitt Trigger 710 of the magnetic sensor at a fast enough rate that the 1/f noise of the Schmitt Trigger 710 at the output of the magnetic sensor is decreased. A frequency or period counter 730 receives an output signal of the oscillator. A value of an inductance L of the oscillator is dependent upon the intensity of the externally applied magnetic field. Therefore, the value at the output of the counter 730 is dependent upon the intensity of the externally applied magnetic field.

Figure 8:
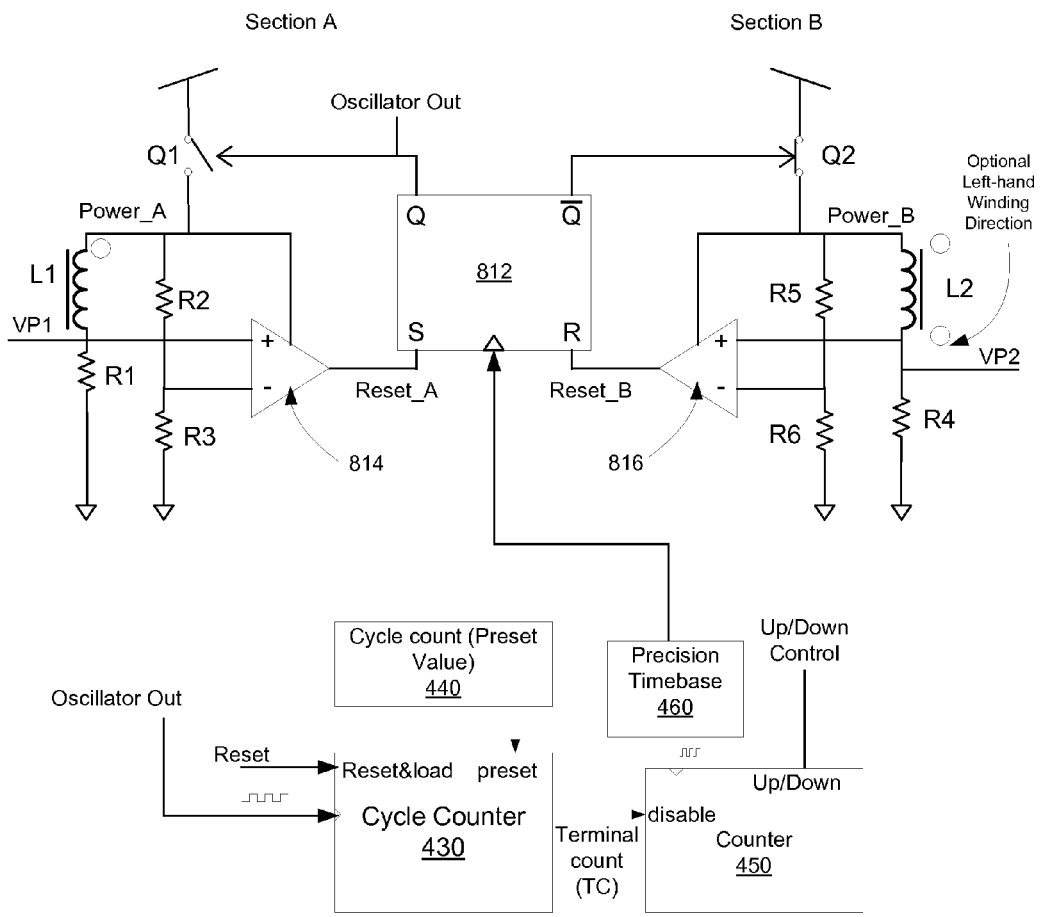
FIG. 8 shows an example of a two stage relaxation LR oscillator that includes magneto-inductive sensors, an active device bias reset every half of a clock cycle.

FIG. 8 shows an example of a two stage relaxation LR oscillator that includes magneto-inductive sensors, an active device bias reset every half of a clock cycle. More specifically, FIG. 8 is a schematic for an astable multi-vibrator class oscillator that resets the bias of alternate comparators (active devices) 814 and 816 every half-cycle. In this illustration, the bias reset is accomplished by removing power to comparators 814 and 816 through switches Q1 and Q2. For simplicity Q1 and Q2 are shown as switches but are typically transistor circuits. Alternatively, the bias of strategic sub-circuits of the comparators can be reset. Examples of the sub-circuits which are preset include, but is not limited to, a first differential amplifier stage of the comparators and/or a tail current bias generator of the comparators.

Figure 9:
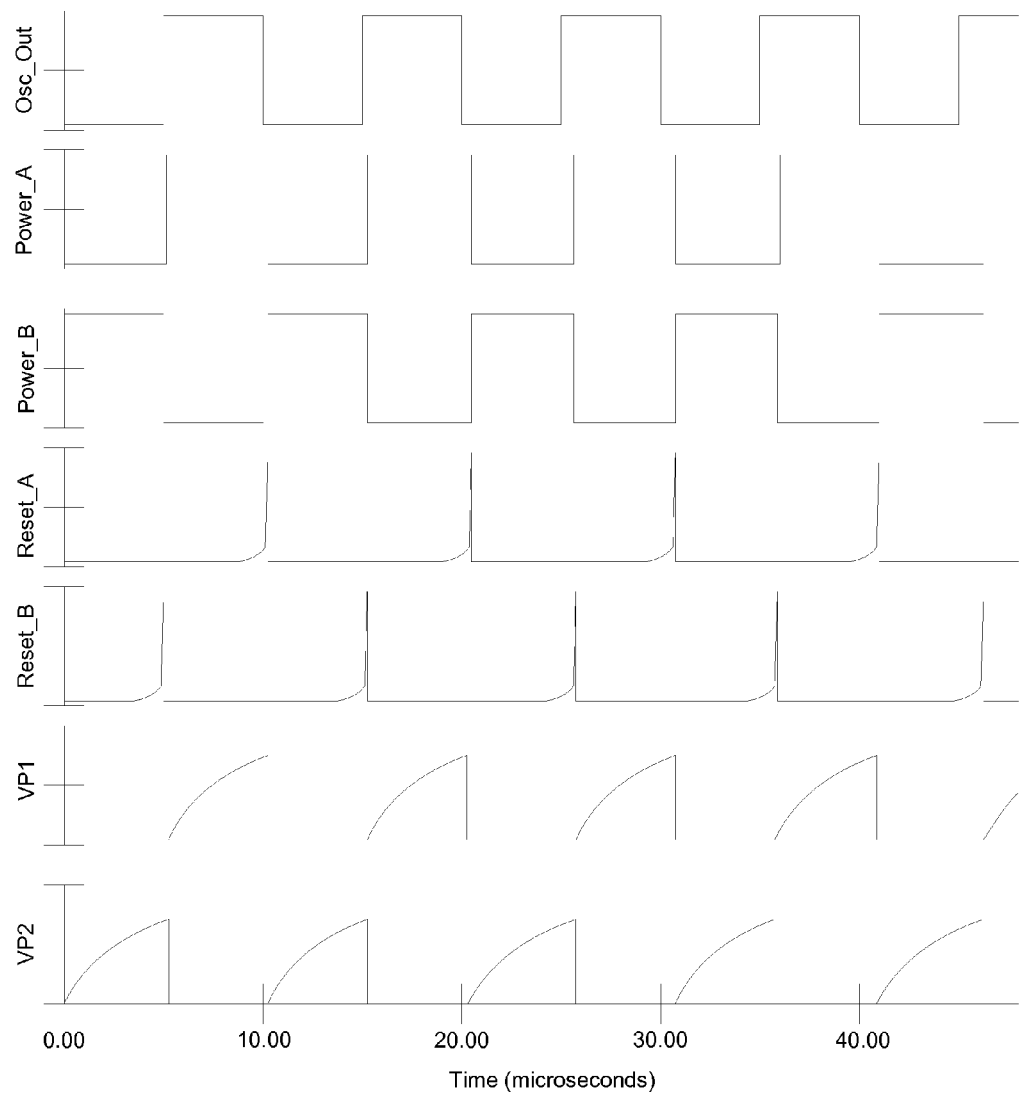
FIG. 9 shows an example of a timing diagram that illustrates the operating of the two stage relaxation LR oscillator of FIG. 8.

FIG. 9 shows an example of a timing diagram that illustrates the operating of the two stage relaxation LR oscillator of FIG. 8. As shown in the timing diagram of FIG. 9, it is assumed that the state of Q1 and Q2 as depicted FIG. 8 are such that when the circuit powers up, the Set/Reset (SR) flip-flop (812) Q output is in a logic Low condition and Q-not (or Q-bar) is in a High condition. As the Oscillator output (Osc_Out) starts Low, Q2 is in the 'On' state (conducting) and Q1 is 'Off' (non-conducting). The voltage at VP2 then rise at a rate of $K-e^{(-t*R4/L2)}$ until it exceeds the voltage on the negative terminal of comparator 816, which is set by the voltage divider formed by R5 and R6. When this happens the comparator 816 output goes high causing the SR flip-flop's (812) Q-bar output to go low, which removes power to section Phase B of the circuit. This completes one half cycle of the oscillator function. The SR flip-flop Q output then goes high turning on Q1 which powers the phase A section of the circuit and it completes one half cycle as described in the phase-B half cycle, which completes one full cycle. FIG. 9 shows waveforms Osc_out, Power_A, Power_B, Reset_A, Reset_B, VP_1, and VP_2 as shown in FIG. 8.

The period of oscillation of the oscillator output signal is measured by the cycle counter 430, the count cycle 440, the counter 450 and the precision time-base 460. The timing of the oscillator is dependent on the values of R1, R4, L1 and L2. Assuming R1 and R2 are fixed values the period of oscillation of this circuit is then directly proportional to the inductance of L1 and L2. If L1 and L2 are magneto-inductive sensors and are aligned parallel to one another and both coils are MI sensors wound in the same direction, they form a magnetometer with an output period of oscillation proportional to the average magnetic field magnitude incident to both of the magneto-inductive sensors. The Up/Down control in the period counter 450 can be toggled at each half cycle to measure the time difference of each half of the oscillator, which is proportional to the difference of the field incident on both MI sensors forming a magnetic gradiometer function.

If L2 is wound in the opposite direction as L1, they form a circuit that can measure the directionality of the incident magnetic field as well as magnitude utilizing the combination of a full cycle period measurement circuit and half cycle period measurement circuit as described above.

A variation to the embodiment of FIG. 8 includes additional circuitry to electrically flip the current flow direction through L1 and L2 on every half cycle, full cycle or alternating full cycle. This can provide temperature common mode rejection through each sensor and provide a magnitude and direction signal output of the period counter 450.

Another possible variation to the embodiment of FIG. 8 includes the Phase A and Phase B half-cycle circuits sharing the same magneto-inductive (MI) sensor. This may require additional circuitry to allow the collapse of the sensor's induced field before starting of the next measurement phase.

Another possible variation to the embodiment of FIG. 8 includes a ripple counter and some digital logic used in place of the SR flip-flop 812 to enable synchronous multi-axis measurements. Embodiments includes 3 or 6 MI sensors to measure 3 orthogonal axes without interfering with each other by taking turns in half-cycle increments creating very low time phase differences between axes measurements.

Figure 10:
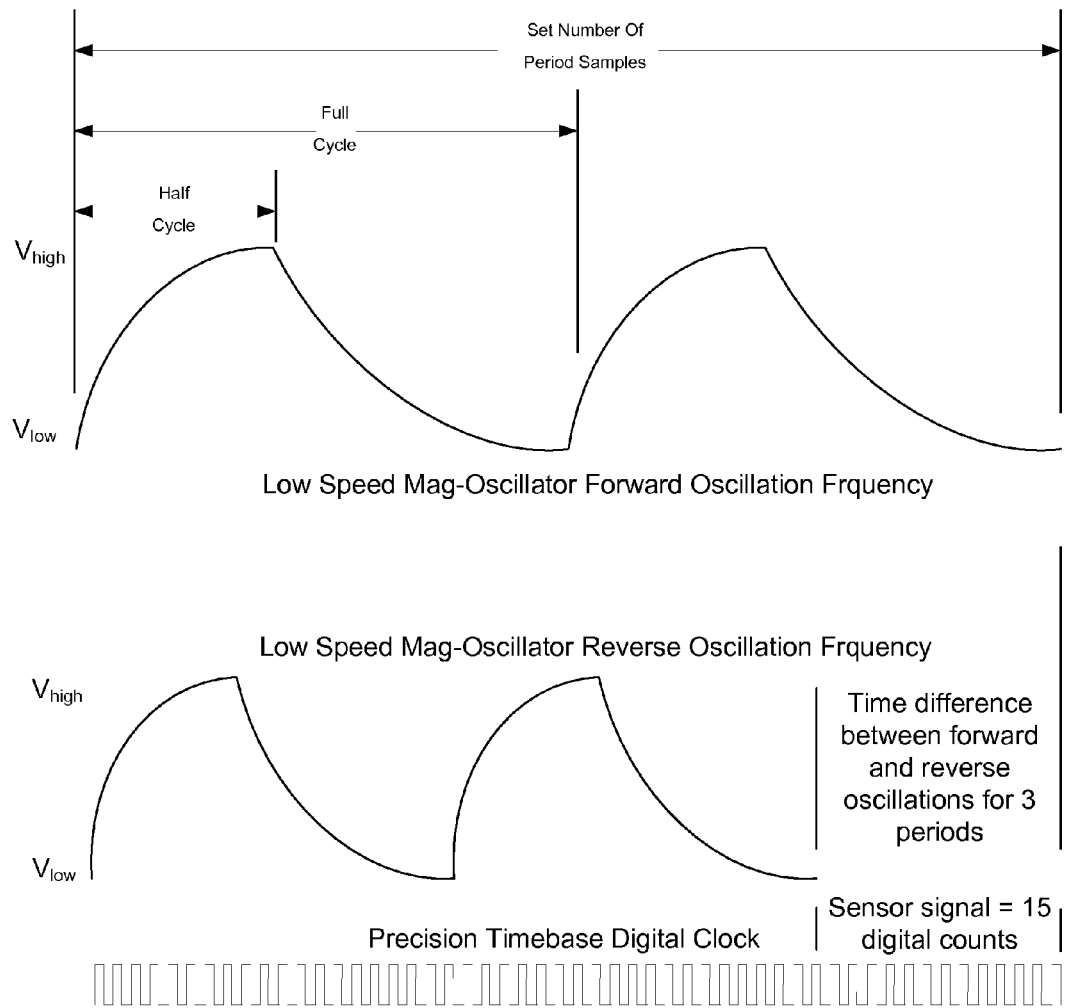
FIG. 10 shows an example of a sensor output signal, and shows locations (timing) in which the sensor output signal may be sampled.

FIG. 10 shows an example of a sensor output signal, and shows locations (timing) in which the sensor output signal may be sampled. FIG. 10 includes an example of a magnetic oscillator count in the forward (FWD Bias) direction, and the magnetic oscillator count in the reverse (REV Bias) direction. The resetting of the active device of the sensor oscillator can occur at one or more of several strategic points in time. The reset can occur once per half cycle, once per full cycle or once per set number of periods (cycles). The example of FIG. 10 shows the precision time base clock (for example, the precision time base 460 of FIG. 8) being counted in the forward direction, and then in the reverse direction. A sample can be defined as the entire cycle of counting up and then counting down, plus the time difference. The resetting of the active device can occur once per period sample, or once per multiple samples. Additionally, the number of samples between each reset can be adjustable. More generally, an embodiment includes the resetting of the bias of the active device occurring outside of an active region of a cycle of the output signal.

For embodiments that include a relaxation oscillator, the active region is the window of time that spans from when the oscillator signal nears one of the two threshold levels that trigger a polarity change in the oscillator state and up to the time that the oscillator actually switches polarity. More accurately, this window of time (active region) begins at an amount of time prior to when the oscillator signal reaches the triggering threshold level to allow for noise, settling times and/or warm-up times of the switched biased circuitry or any other requirements of the sampling system.

Figure 11:
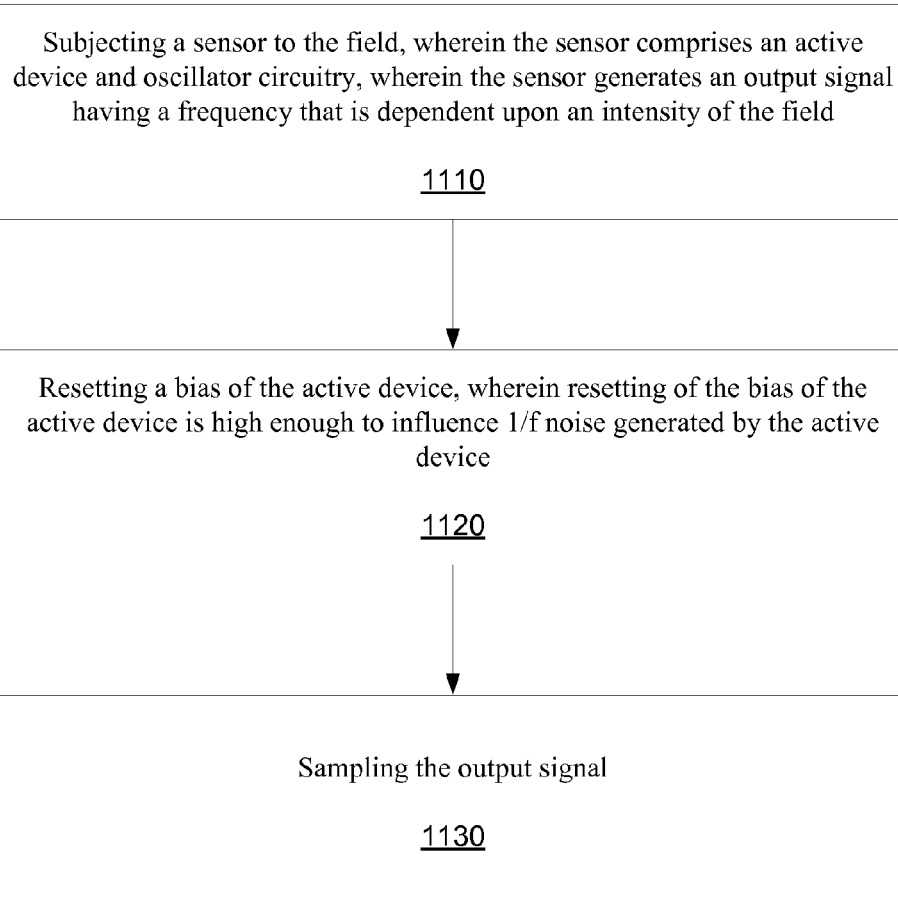
FIG. 11 is a flow chart that includes the steps of an example of a method of sensing a field.

FIG. 11 is a flow chart that includes the steps of an example of a method of sensing a field. A first step 1110 includes subjecting a sensor to the field, wherein the sensor comprises an active device and oscillator circuitry, wherein the sensor generates an output signal having a frequency that is dependent upon an intensity of the field. A second step 1120 includes resetting a bias of the active device, wherein resetting of the bias of the active device is high enough to influence 1/f noise generated by the active device. A third step 1130 includes sampling the output signal.

As previously described, an embodiment includes a sampling rate of the sampling being high enough to provide over-sampling of the output signal. Further, another embodiment includes the reset-rate being set to be high enough that the 1/f noise generated by the active device does not influence a signal to noise ratio of the over-sampled output signal. Further, another embodiment includes the resetting of the bias of the active device occurring between samples of the output signal.

FIG. 12 is a flow chart that includes the steps of another example of a method of sensing a field. A first step 1210 includes subjecting a sensor to the field, wherein the sensor comprises an active device and oscillator circuitry, wherein the sensor generates an output signal having a frequency that is dependent on the field. A second step 1220 includes resetting a bias of the active device, wherein the bias of the active device is reset at a rate high enough to influence 1/f noise generated by the active device. A third step 1230 includes counting samples of the output signal with a signed up/down counter, wherein an output of the signed up/down counter provides a representation of an intensity and a direction of the applied field.

Embodiments include timing the resetting of the bias of the active device to occur between counted samples of the output signal, or occurring outside of an active region of a cycle of the output signal.

As described, an embodiment of the sensor includes a two stage relaxation oscillator, and resetting of the bias of the active device occurs every half of a clock cycle of the relaxation oscillator.

Figure 13:
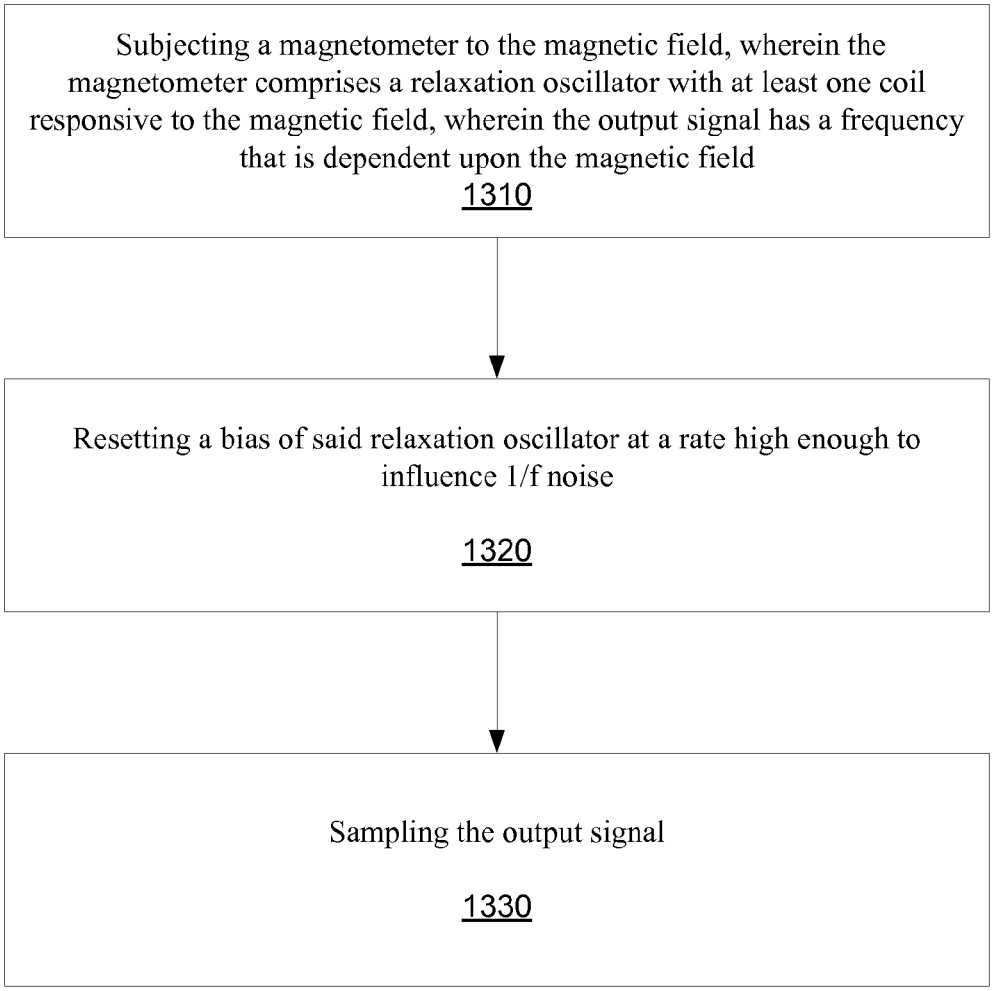
FIG. 13 is a flow chart that includes the steps of another example of a method of sensing a magnetic field.

FIG. 13 is a flow chart that includes the steps of another example of a method of sensing a magnetic field. A first step 1310 includes subjecting a magnetometer to the magnetic field, wherein the magnetometer comprises a relaxation oscillator with at least one coil responsive to the magnetic field, wherein the output signal has a frequency that is dependent upon the magnetic field. A second step 1320 includes resetting a bias of said relaxation oscillator at a rate high enough to influence 1/f noise. A third step 1330 includes sampling the output signal.

Various Embodiments of Sensors

An embodiment of a sensor includes a relaxation oscillator that includes at least one coil responsive to a stimulus, wherein the output signal has a frequency that is dependent upon the stimulus. The sensor further includes a bias reset control for resetting a bias of the relaxation oscillator at a rate high enough to influence 1/f noise, and a sampler for sampling the output signal.

Another embodiment of a sensor includes an active device, wherein the sensor generates an output signal that is dependent on a stimulus. The sensor further includes a bias reset controller for resetting a bias of the active device, and a sampler for sampling the output signal, wherein a reset-rate of the resetting of the bias of the active device is high enough to influence 1/f noise generated by the active device. For a more specific embodiment, the sensor further includes oscillator circuitry, and the sensor generates the output signal having a frequency that is dependent on the stimulus.

Another embodiment of a sensor includes an active device, wherein the sensor generates an output signal that is dependent on a stimulus. The sensor further includes a bias reset controller operative to reset a bias of the active device, and a signed up/down counter, wherein an output of the signed up/down counter provides a representation of the intensity and a direction of the stimulus, and wherein a reset-rate of the resetting of the bias of the active device is high enough to influence 1/f noise generated by the active device. For a more specific embodiment, the sensor includes oscillator circuitry, and the sensor generates the output signal having a frequency that is dependent on the stimulus.

Generalized Field Sensor Embodiments

While several of the described sensors include the generation of an output signal wherein a frequency of the output signal is dependent on an applied field, it is to be understood that field sensors in general can benefit from at least some of the described embodiments that includes sampling of the output signal of the field sensor. That is, some embodiments of sensors generate an output that does not have a frequency component (for example, a DC (direct current) or near-DC signal). However, even these sensors can include an active device (that is, circuits the include transistors), and additionally, include sampling of an output signal. Such embodiments may include, but are not limited to, operational amplifiers, comparators, switches, converters and reference generators.

Although specific embodiments have been described and illustrated, the described embodiments are not to be limited to the specific forms or arrangements of parts so described and illustrated. The embodiments are limited only by the appended claims.

What is claimed:
1. A magnetometer, comprising:
a relaxation oscillator comprising at least one coil that is responsive to an applied field, wherein the relaxation oscillator generates an output signal that has a frequency that is dependent upon the applied field;

a bias reset control for resetting a bias of the relaxation oscillator at a rate, wherein the rate is set high enough to influence 1/f noise of the relaxation oscillator;

a sampler for sampling the output signal.

2. The magnetometer of claim 1, wherein a sampling rate of the sampling of the sampler is set high enough to provide over-sampling of the output signal.

3. The magnetometer of claim 2, wherein the relaxation oscillator comprises an active device and the bias reset control resets a bias of the active device, and wherein a rate of the bias reset is set high enough that the 1/f noise generated by the active device does not influence a signal to noise ratio of the over-sampled output signal.

4. A magnetometer, comprising:
a sensor responsive to an applied field, comprising;
an active device and oscillator circuitry, wherein the sensor generates an output signal having a frequency that is dependent on the applied field;
a bias reset controller for resetting a bias of the active device;
a sampler for sampling the output signal; wherein
a reset-rate of the resetting of the bias of the active device is set to maintain 1/f noise of the active device below a threshold.

5. The magnetometer of claim 4, wherein the sensor comprises a plurality of active devices and only a subset of the plurality of devices is reset at any point in time.

6. The magnetometer of claim 4, wherein a sampling rate of the sampling is set high enough to provide over-sampling of the output signal.

7. The magnetometer of claim 6, wherein the reset-rate is set high enough that the 1/f noise generated by the active device does not influence a signal to noise ratio of the over-sampled output signal.

8. The magnetometer of claim 4, wherein resetting of the bias of the active device occurs between samples of the output signal.

9. The magnetometer of claim 4, further comprising a signed up/down counter, and an output of the signed up/down counter provides a representation of the intensity and a direction of the applied field.

10. The magnetometer of claim 4, wherein the sampler comprises a signed period up/down counter that counts the samples, and the resetting of the bias occurs between transitions of counting up and counting down.

11. The magnetometer of claim 4, wherein the sampler comprises a counter, and the counter comprises a two stage relaxation oscillator that resets the bias every half of a clock cycle.

12. A magnetometer, comprising:
a sensor responsive to an applied field, comprising;
an active device and oscillator circuitry, wherein the sensor generates an output signal having a period that is dependent on the applied field;
a bias reset controller operative to reset a bias of the active device; and
a signed up/down counter, wherein an output of the signed up/down counter provides a representation of the intensity and a direction of the applied field; wherein
a reset-rate of the resetting of the bias of the active device is set high enough to influence 1/f noise generated by the active device.

13. The magnetometer of claim 12, wherein the sensor comprises a plurality of active devices and only a subset of the plurality of devices is reset at any point in time.

14. The magnetometer of claim 12, wherein the resetting of the bias of the active device occurs between counted samples.

15. The magnetometer of claim 12, wherein the resetting of the bias of the active device occurs outside of an active region of a cycle of the output signal.

16. The magnetometer of claim 12, wherein the resetting of the bias of the active device occurs between half-cycles of the output signal.

17. The magnetometer of claim 12, wherein the resetting of the bias of the active device occurs between cycles of the output signal.

18. The magnetometer of claim 12, wherein the resetting of the bias of the active device occurs between up counts and down counts of the signed up/down counter.

19. The magnetometer of claim 12, wherein the resetting of the bias of the active device occurs between up counts of the signed up/down counter.

20. The magnetometer of claim 12, wherein the reset rate is selected to maintain 1/f noise of the active device below a threshold.

21. The magnetometer of claim 12, further comprising accumulating multiple samples.

22. The magnetometer of claim 21, wherein the reset-rate is set high enough that the 1/f noise generated by the active device does not influence a signal to noise ratio of the sampled signal.

23. The magnetometer of claim 12, wherein the sensor comprises a two stage relaxation oscillator that resets the bias of the active device occurs every half of a clock cycle of the relaxation oscillator.

24. A method of sensing a magnetic field, comprising:
subjecting a magnetometer to the magnetic field, wherein the magnetometer comprises a relaxation oscillator with at least one coil responsive to the magnetic field, wherein the output signal has a frequency that is dependent upon the magnetic field;
resetting a bias of said relaxation oscillator at a rate, wherein the rate is set high enough to influence 1/f noise of the relaxation oscillator; and
sampling the output signal.

25. A method of sampling a field, comprising:
subjecting a sensor to the field, wherein the sensor comprises an active device and oscillator circuitry, wherein the sensor generates an output signal having a frequency that is dependent on the field;
resetting a bias of the active device; and
sampling the output signal; wherein
resetting the bias of the active device at a rate, wherein the rate is set high enough to influence 1/f noise generated by the active device.

26. The method of claim 25, wherein a sampling rate of the sampling is set high enough to provide over-sampling of the output signal.

27. The method of claim 26, wherein the reset-rate is set high enough that the 1/f noise generated by the active device does not influence a signal to noise ratio of the over-sampled output signal.

28. The method of claim 25, wherein resetting of the bias of the active device occurs between samples of the output signal.

29. A method of sampling a field, comprising:
subjecting a sensor to the field, wherein the sensor comprises an active device and oscillator circuitry, wherein the sensor generates an output signal having a frequency that is dependent on the field;
resetting a bias of the active device; and
counting samples of the output signal with a signed up/down counter, wherein an output of the signed up/down counter provides a representation of an intensity and a direction of the applied field; wherein resetting the bias of the active device at a reset rate, wherein the reset rate is selected to maintain 1/f noise of the active device below a threshold.

30. The method of claim 29, wherein the resetting of the bias of the active device occurs between counted samples of the output signal.

31. The method of claim 29, wherein the resetting of the bias of the active device occurs outside of an active region of a cycle of the output signal.

32. The method of claim 29, wherein the sensor comprises a two stage relaxation oscillator, and resetting of the bias of the active device occurs every half of a clock cycle of the relaxation oscillator.

* * * * *